United States Patent
Parvarandeh

(10) Patent No.: US 9,343,426 B1
(45) Date of Patent: May 17, 2016

(54) USE OF DEVICE ASSEMBLY FOR A GENERALIZATION OF THREE-DIMENSIONAL METAL INTERCONNECT TECHNOLOGIES

(71) Applicant: Maxim Integrated Products, Inc., San Jose, CA (US)

(72) Inventor: Pirooz Parvarandeh, Los Altos Hills, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/735,821

(22) Filed: Jan. 7, 2013

Related U.S. Application Data

(63) Continuation of application No. 12/792,565, filed on Jun. 2, 2010, now Pat. No. 8,349,653.

(51) Int. Cl.
*H01L 21/00* (2006.01)
*H01L 23/00* (2006.01)
*H01L 25/065* (2006.01)
(Continued)

(52) U.S. Cl.
CPC ............. *H01L 24/95* (2013.01); *H01L 21/673* (2013.01); *H01L 23/13* (2013.01); *H01L 24/97* (2013.01); *H01L 25/0657* (2013.01); *H01L 2221/68313* (2013.01); *H01L 2224/24137* (2013.01); *H01L 2924/15153* (2013.01); *H01L 2924/15155* (2013.01)

(58) Field of Classification Search
CPC .................. H01L 2224/24227; H01L 2224/97; H01L 2224/24137; H01L 2224/81898; H01L 2924/15153; H01L 2924/15155; H01L 2924/10158; H01L 24/96; H01L 24/97; H01L 23/13; H01L 21/2007; H01L 21/673; H01L 2221/68313
USPC ........................................................ 257/704
See application file for complete search history.

(56) References Cited

U.S. PATENT DOCUMENTS 5,121,176 A 6/1992 Quigg
5,252,848 A 10/1993 Adler et al.
(Continued)

FOREIGN PATENT DOCUMENTS

JP 2004135163 4/2004

OTHER PUBLICATIONS

T. Makkonen et al. "Estimating Materials Parameters in Thin-Film BAW Resonators Using Measured Dispersion", Jan. 2004, pp. 42-51, IEEE, vol. 51, No. 1.

*Primary Examiner* — Jenny L Wagner
*Assistant Examiner* — Abbigale Boyle
(74) *Attorney, Agent, or Firm* — Advent, LLP

(57) ABSTRACT

An assembly process properly positions and align a plurality of first die within a carrier substrate. The first die are positioned within cavities formed in the carrier substrate. The carrier substrate is then aligned with a second substrate having a plurality of second die fabricated therein. The first die and the second die are fabricated using different technologies. Aligning the carrier substrate and the second substrate aligns the first die with the second die. One or more first die can be aligned with each second die. Once aligned, a wafer bonding process is performed to bond the first die to the second die. In some cases, the carrier substrate is removed, leaving behind the first die bonded to the second die of the second substrate. In other cases, the carrier substrate is left in place as a cap. The second substrate is then cut to form die stacks.

4 Claims, 5 Drawing Sheets

(51) Int. Cl.
*H01L 21/673* (2006.01)
*H01L 23/13* (2006.01)

(56) References Cited

U.S. PATENT DOCUMENTS

| | | | |
|---|---|---|---|
| 5,273,922 A | 12/1993 | Tsoi | |
| 5,545,291 A | 8/1996 | Smith et al. | |
| 5,583,378 A * | 12/1996 | Marrs et al. | 257/710 |
| 5,585,294 A | 12/1996 | Smayling et al. | |
| 5,719,085 A | 2/1998 | Moon et al. | |
| 5,757,072 A * | 5/1998 | Gorowitz et al. | 257/700 |
| 5,811,850 A | 9/1998 | Smayling et al. | |
| 5,844,347 A | 12/1998 | Takayama et al. | |
| 6,091,110 A | 7/2000 | Hebert et al. | |
| 6,118,167 A | 9/2000 | DiSimone et al. | |
| 6,143,623 A | 11/2000 | Tsuda et al. | |
| 6,144,069 A | 11/2000 | Tung | |
| 6,242,787 B1 | 6/2001 | Nakayama et al. | |
| 6,258,692 B1 | 7/2001 | Chu et al. | |
| 6,274,508 B1 | 8/2001 | Jacobsen et al. | |
| 6,281,038 B1 | 8/2001 | Jacobsen et al. | |
| 6,291,896 B1 | 9/2001 | Smith | |
| 6,307,447 B1 | 10/2001 | Barber et al. | |
| 6,333,232 B1 | 12/2001 | Kunikiyo | |
| 6,335,259 B1 | 1/2002 | Jeng | |
| 6,399,461 B1 | 6/2002 | Liu et al. | |
| 6,413,827 B2 | 7/2002 | Farrar | |
| 6,417,025 B1 | 7/2002 | Gengel | |
| 6,420,266 B1 | 7/2002 | Smith et al. | |
| 6,444,541 B1 | 9/2002 | Lai et al. | |
| 6,448,109 B1 * | 9/2002 | Karpman | 438/108 |
| 6,455,399 B2 | 9/2002 | Malik et al. | |
| 6,472,324 B2 | 10/2002 | Kusakabe et al. | |
| 6,472,708 B1 | 10/2002 | Hshieh et al. | |
| 6,479,395 B1 | 11/2002 | Smith et al. | |
| 6,482,718 B2 | 11/2002 | Shiozawa et al. | |
| 6,495,424 B2 | 12/2002 | Kunikiyo | |
| 6,495,898 B1 | 12/2002 | Iwamatsu et al. | |
| 6,524,929 B1 | 2/2003 | Xiang et al. | |
| 6,527,964 B1 | 3/2003 | Smith et al. | |
| 6,528,395 B2 | 3/2003 | Nakamura | |
| 6,541,382 B1 | 4/2003 | Cheng et al. | |
| 6,555,408 B1 * | 4/2003 | Jacobsen et al. | 438/28 |
| 6,566,744 B2 | 5/2003 | Gengel | |
| 6,586,338 B2 | 7/2003 | Smith et al. | |
| 6,596,607 B2 | 7/2003 | Ahn | |
| 6,606,247 B2 | 8/2003 | Credelle et al. | |
| 6,623,579 B1 | 9/2003 | Smith et al. | |
| 6,624,016 B2 | 9/2003 | Wu | |
| 6,657,289 B1 | 12/2003 | Craig et al. | |
| 6,731,353 B1 | 5/2004 | Credelle et al. | |
| 6,743,695 B2 | 6/2004 | Lee et al. | |
| 6,747,333 B1 | 6/2004 | Xiang et al. | |
| 6,750,117 B1 | 6/2004 | Hung et al. | |
| 6,780,696 B1 | 8/2004 | Schatz | |
| 6,781,194 B2 | 8/2004 | Baliga | |
| 6,816,380 B2 | 11/2004 | Credelle et al. | |
| 6,919,225 B2 | 7/2005 | Craig et al. | |
| 6,979,621 B2 | 12/2005 | Hshieh et al. | |
| 6,985,361 B2 | 1/2006 | Credelle et al. | |
| 7,033,909 B2 | 4/2006 | Kim et al. | |
| 7,080,444 B1 | 7/2006 | Craig et al. | |
| 7,101,502 B2 | 9/2006 | Smith et al. | |
| 7,112,513 B2 | 9/2006 | Smythe, III et al. | |
| 7,126,193 B2 | 10/2006 | Baiocchi et al. | |
| 7,141,176 B1 | 11/2006 | Smith et al. | |
| 7,172,789 B2 | 2/2007 | Smith et al. | |
| 7,214,569 B2 | 5/2007 | Swindlehurst et al. | |
| 7,235,845 B2 | 6/2007 | Xu et al. | |
| 7,244,326 B2 | 7/2007 | Craig et al. | |
| 7,260,882 B2 | 8/2007 | Credelle et al. | |
| 7,275,424 B2 * | 10/2007 | Felton et al. | 73/104 |
| 7,282,765 B2 | 10/2007 | Xu et al. | |
| 7,288,432 B2 | 10/2007 | Jacobsen et al. | |
| 7,291,541 B1 | 11/2007 | Foote | |
| 7,297,582 B2 | 11/2007 | Abadeer et al. | |
| 7,321,159 B2 | 1/2008 | Schatz | |
| 7,353,598 B2 | 4/2008 | Craig et al. | |
| 7,452,748 B1 | 11/2008 | Craig et al. | |
| 7,479,688 B2 | 1/2009 | Deshpande et al. | |
| 7,504,676 B2 | 3/2009 | Bhalla et al. | |
| 7,531,218 B2 | 5/2009 | Smith et al. | |
| 7,542,301 B1 | 6/2009 | Liong et al. | |
| 7,615,479 B1 | 11/2009 | Craig et al. | |
| 2001/0000650 A1 * | 5/2001 | Akram | G01R 1/0483 324/750.25 |
| 2002/0197823 A1 | 12/2002 | Yoo et al. | |
| 2003/0071348 A1 * | 4/2003 | Eguchi et al. | 257/723 |
| 2004/0115881 A1 | 6/2004 | Choi et al. | |
| 2006/0141731 A1 | 6/2006 | Kim | |
| 2006/0183296 A1 | 8/2006 | Yoo et al. | |
| 2006/0210769 A1 | 9/2006 | Swindlehurst et al. | |
| 2007/0032029 A1 | 2/2007 | Chow et al. | |
| 2007/0254453 A1 | 11/2007 | Ang | |
| 2008/0124890 A1 | 5/2008 | Wu et al. | |
| 2008/0286936 A1 | 11/2008 | Zhao | |
| 2008/0293213 A1 | 11/2008 | Yang et al. | |

* cited by examiner

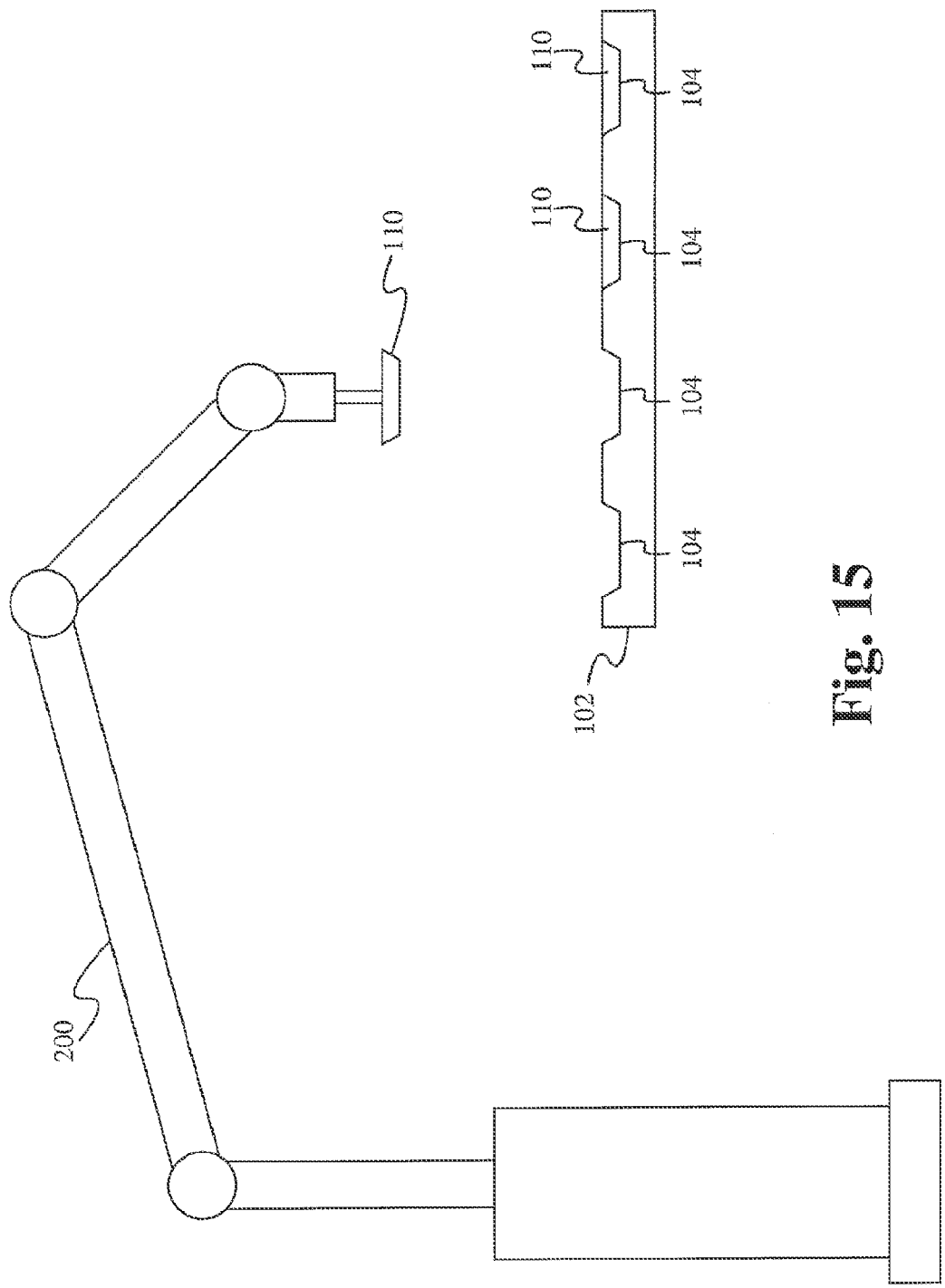

USE OF DEVICE ASSEMBLY FOR A GENERALIZATION OF THREE-DIMENSIONAL METAL INTERCONNECT TECHNOLOGIES

CROSS REFERENCE TO RELATED APPLICATIONS

The present application is a Continuation under 35 U.S.C. §120 of U.S. patent application Ser. No. 12/792,565 filed Jun. 2, 2010, entitled "THE USE OF DEVICE ASSEMBLY FOR A GENERALIZATION OF THREE-DIMENSIONAL METAL INTERCONNECT TECHNOLOGIES," which application is hereby incorporated by reference in its entirety.

FIELD

The present disclosure relates to the field of semiconductor device assembly. More particularly, the present disclosure relates to the field of semiconductor device assembly and three-dimensional metal interconnect technologies.

BACKGROUND

Circuit miniaturization and system miniaturization are well known goals in the electronics industry. Much miniaturization takes place by increasing integration onto a single semiconductor die, commonly known as an integrated circuit or as a chip. As is well known, some circuit functions are better performed by chips formed on one type of semiconductor process whereas other circuit functions are better performed by chips formed on a different type of semiconductor process. Examples of such disparate circuit functions include analog versus digital circuits, and also high power versus low power circuit applications. Generally, a single chip cannot be manufactured with two or more different semiconductor processes.

To miniaturize an electronic system having chips formed using different semiconductor fabrication technologies, a trend in the integrated circuit industry is to electrically couple such circuits together. Currently, the industry has techniques for positioning two die side by side, each die having of a different fabrication technology. Each die is picked and placed into a package. There are bonding wires that connect each die to external connections and/or to each other. This is referred to as a side by side technique. Another technique for joining two disparate chips together is to stack a first die on top of a second die, usually both die are face up. Each of these two die are electrically coupled to external connections and/ or interconnected via bond wires. This is referred to as a stacked die technique. A modification of the stacked die technique is that the first die is configured as a flip-chip die. To assemble the first die and the second die, the first die is flipped upside down, then picked and placed onto the top of the second die, such that the "top" surface, now upside down, of the first die is placed on the top surface of the second die.

The interface surfaces of both the first die and the second die are configured with solder ball interconnects such that some level of interconnect is formed between the first die and the second die when assembled. This modified stacked die technique can be performed using a CSP (Chip Scale Package) type technology. In either the side by side technique or the stacked die technique, the first die is singulated meaning the wafer on which the first die was fabricated has been cut to form separate, individual die, the second die is singulated, and the assembly process requires some means to pick and place the two together and connect them. An advantage of the side by side technique and the stacked die technique is that all die can be pre-tested for proper functionality, and are therefore known good die.

Another technique for connecting disparate type die is a wafer bonding technique, which forms three-dimensional metal interconnects between die on the wafers being bonded. In some cases, such three-dimensional metal interconnects include through silicon vias. The wafer bonding technique bonds together a first wafer and a second wafer, where the second wafer has die of a different technology than the die on the first wafer, but the die on both wafers have the same size, spacing, and repetition rate. There are exposed metal interconnects on a surface of each die for both the first wafer and the second wafer. The two wafers are placed together so that the surfaces with exposed metal interconnects face each other. The two wafers are bonded together and the interconnects of the interfacing surfaces of the two wafers are intimately connected. This bonds one die, on the first wafer, on top of another die, on the second wafer. The bonded wafer stack is then cut to singulate the individual die stacks. The bonding of the two wafers is done according to the chemical compositions of the two wafers. There are other chemistries that can be used. For example, there can be other types of material(s) that are deposited on the wafers so that when the two wafers are bonded together, the melting temperature for those interface materials is used. Other bonding techniques can be used that are well known in the art.

One advantage of the wafer bonding technique is that a high density of interconnects can be achieved between the two wafers because the wafers typically have very fine geometry resolution interconnects and therefore the metalization between the two wafers is at a small level.

Compared to the stacked die technique that uses solder balls, where the solder balls are typically 100 microns or more in diameter, the number of interconnects is much more limited. As such, the parasitic characteristics associated with the interconnects are lower using the wafer bonding technique than the stacked die technique. Also, the stacked die technique uses a pick and place process, where each die is individually placed. In contrast, the wafer bonding technique uses a batch process, so there is economies of scale.

The wafer bonding technique has several disadvantages. First, the wafer bonding technique requires that each die on the first wafer is equal in size to each die on the second wafer. If the die are not the same size, the small die will require wasted space be formed between adjacent die to provide the same spacing as for the larger die on the other wafer. Second, the wafer bonding technique requires that the first wafer is equal in size to the second wafer. Third, the bonding of two wafers limits interfacing to two separate technologies, a first technology of the first wafer, such as CMOS, and a second technology of the second wafer, such as Galium Arsenide (GaAs) or Galium Nitride (GaN). However, the face-to-face interface of the first and second wafers does not enable a configuration to introduce a third, or more, additional technology. A fourth disadvantage of the wafer bonding technique is that the die on each wafer are not pre-tested for proper functionality, and are therefore subject to yield constraints for both the first wafer and the second wafer. In other words, there is a first defect density associated with the first wafer, and there is a second defect density associated with the second wafer. Stacking and bonding the two wafers means the resulting die stacks have defect densities that are cumulative of both the first wafer and the second wafer. A die stack with a first die from the first wafer and a second die from the second wafer may be defective if either the first die is defective or the second die is defective.

If the conditions for wafer bonding are not met, then it is possible to singulate the die of the first wafer and to attach the singulated first die to the second die still part of the second wafer using a pick and place technique. Pick and place machines are robotic machines used to place surface-mount devices onto a printed circuit board (PCB) or other substrate. This technique has the disadvantage that it is not done in batch mode. Another disadvantage is that applications requiring precise placement necessitate high resolution, high precision robotic equipment to properly align and place the singulated first die on the second die.

Fluidic self-assembly is a process by which die are added to a fluid solution, which is then distributed across a substrate. One type of fluidic self-assembly is a shaped-based technique. Cavities of a specified shape and size are formed in a top surface of the substrate.

The shape and size of the die and the corresponding cavities are such that a die falls into a cavity according to a specific alignment, thereby self-aligning.

FIG. 1 illustrates a cut-out side view of a substrate 2 having a plurality of cavities 4 formed in a top surface 6 of the substrate 2. In an exemplary configuration, a cut-out side profile of each cavity is trapezoidal in shape. In the case of silicon, the trapezoidal shape is a result of a standard etching process that creates sidewalls with very precise angles. As shown in FIG. 1, each of the trapezoidal-shaped cavities has sides 8 that taper inward moving downward from the top surface 6. As is well known, the trapezoidal-shaped cavities can be formed using an appropriate etch process on a surface of a silicon wafer in a proper crystal orientation. The number and positions of the cavities are formed according to a specified pattern across the top surface of the substrate. The cavities are formed such that correspondingly shaped and sized die can be positioned within the cavities accordingly to a specific alignment. The die are fabricated from a second substrate using known semiconductor integrated circuit fabrication technology.

Once singulated, the die have a shape and size complimentary to the cavities 4 in the substrate 2, for example the trapezoidal cross section shape and a size to correspond to the cavities 4. In some embodiments, the active circuitry of each die is on the elongated, or top surface, of the trapezoidal shape. The plurality of singulated die are placed in a fluid, typically water. The substrate 2 is positioned at an angle, such as shown in FIG. 2, and the fluid with die 10 is poured down the angled substrate 2 so that the die are gravity fed down the face of the angled substrate. Because the cavities 4 on the substrate 2 are trapezoidal-shaped, and the die 10 have the same trapezoidal shape, and because the cavities 4 have a predetermined size, and the die 10 have the corresponding size, there is only one orientation where a die 10 fits within a cavity 4, thereby self-assembling the die 10 within the substrate 2.

Referring to FIGS. 1 and 2, a die 10 can only fall into the cavity 4 with the bottom, narrower portion of the die positioned at the bottom of the cavity and the top, wider portion of the die positioned at the top of the cavity. In other words, the die is positioned narrow-side down in the cavity. Referring to FIG. 2, only the left hand die 10 is oriented properly to fit within one of the cavities 4. The other two die shown are not properly aligned and therefore will not properly fall within any of the cavities 4 while in their current alignment. During fluid flow, the die are constantly moving and therefore shifting their alignment. Any die 10 that do not fall into a cavity 4 on the substrate 2 are recirculated to flow back down the angled substrate 2. This cycling can be performed as many times as desired, until all the cavities 4 on the substrate 2 are filled with die 10, such as shown in FIG. 3. The cavities and die can be configured to properly align in the z-direction (top and bottom surfaces) and also in the x and y-directions such that each specific side of the die is aligned with a specific side of the cavity. In general, the die and the cavities are fabricated with geometries that allow the die to fit correctly and to be properly oriented within the cavity.

The die can be held in place within the cavities by pre-applying a surface treatment within the cavity prior to self-assembly, or by applying a securing means to the die after self-assembly, such as adhesive, solder, or a strap. Electrical connections can be made to the die assembled in the substrate. For example, bonding wires are added to electrically connect the die to metal interconnects on the substrate.

SUMMARY

Embodiments of an assembly process include a self-assembly or self-aligning process to properly position and align a plurality of first die within a carrier substrate. The first die are fabricated according to a first technology. The carrier substrate is then aligned with a second substrate having a plurality of second die fabricated therein. The second substrate, and therefore the plurality of second die, are fabricated according to a second technology different than the first technology. The plurality of first die are positioned within cavities formed in the first interface surface of the carrier substrate. In some embodiments, a fluidic self-assembly process is used to position the plurality of first die in the cavities. In other embodiments, a self-aligning pick and place process is used. The interfacing surfaces of the carrier substrate and the second substrate include active circuitry of the first die and the second die. Aligning the carrier substrate and the second substrate also aligns each of the plurality of first die with the plurality of second die. One or more first die can be aligned with each second die. Once aligned, a wafer bonding process is performed to bond the first die to the second die. Metal interconnects between the active circuitry of the first die and the second die are formed during the wafer bonding process. In some embodiments, once the wafer bonding process is completed, the carrier substrate is removed, leaving behind the plurality of first die bonded to the plurality of second die of the second substrate. A passivation layer or a planarization layer can be added over the plurality of first die and second substrate. In other embodiments, the carrier substrate is left in place to form a cap. The second substrate, and in some embodiments the carrier substrate, is then cut to singulate each of the plurality of second die. Each singulated second die and the one or more first die bonded to the second die form a die stack.

In one aspect, a method of assembly is disclosed. The method includes assembling a plurality of singulated device elements onto a carrier substrate; fabricating a plurality of die on a second substrate; stacking the second substrate and the carrier substrate such that the plurality of die are facing the plurality of device elements; and bonding the plurality of device elements to the plurality of die such that at least one device element is bonded to each die. In some embodiments, the method also includes removing the carrier substrate thereby leaving the plurality of device elements bonded to the plurality of die. In some embodiments, the plurality of singulated device elements comprises a plurality of singulated die fabricated using a technology that is different than a technology used to fabricate the plurality of die on the second substrate. In some embodiments, the plurality of singulated device elements comprises a plurality of passive elements.

In another aspect, another method of assembly is disclosed. The method includes assembling a plurality of singulated first die onto a carrier substrate; fabricating a plurality of second die on a second substrate; stacking the second substrate and the carrier substrate such that the plurality of second die are facing the plurality of first die; and bonding the plurality of first die to the plurality of second die such that at least one first die is operatively bonded to each second die. In some embodiments, operatively binding at least one first die to each second die forms metal interconnects therebetween. In some embodiments, the method also includes removing the carrier substrate thereby leaving the plurality of first die bonded to the plurality of second die. In this embodiment, the method can also include adding a cap structure over the plurality of first die and coupling the cap structure to the second substrate, wherein the cap structure includes a plurality of cavities, each cavity aligned with a corresponding one first die and having a shape and a size that provides a gap between a surface of the cavity and the first die. Alternatively, the method can also include adding a cap structure over the plurality of first die and coupling the cap structure to the second substrate, wherein the cap structure includes a plurality of cavities, each cavity aligned with a corresponding one first die and having a shape and a size that matches the first die. In the embodiment where the carrier substrate is removed, the method can also include applying an insulating layer over the plurality of bonded first die and the second substrate. In the embodiment where the carrier substrate is removed, each of the plurality of first die can be configured with a metalized back surface.

In some embodiments, the second substrate diameter is equal to a diameter of the carrier substrate. In some embodiments, the carrier substrate includes a plurality of cavities formed on a top surface of the carrier substrate, wherein a shape of each cavity is complimentary to a shape of each singulated first die such that each singulated first die fits within each cavity. The shape of each cavity and the shape of each singulated first die can be configured such that each singulated first die fits within each cavity according to a specific orientation. In some embodiments, the carrier substrate coupled to the second substrate forms a cap over the plurality of first die. In this embodiment, each of the plurality of cavities in the carrier substrate can have one or more layers formed therein. In some cases, at least one layer comprises an insulating layer. In other cases, at least one layer comprises a metalized layer. In some embodiments, one or more of the plurality of first die include one or more layers formed on a back side of the first die facing the cavity.

In some embodiments, the carrier substrate includes a plurality of cavities formed on a top surface of the carrier substrate, the plurality of cavities includes at least a set of first cavities and a set of second cavities, a first shape of each first cavity is complimentary to a shape of each singulated first die such that each singulated first die fits within each first cavity, and a second shape of each second cavity is complimentary to a shape of each of a plurality of singulated third die such that each singulated third die fits within each second cavity. In this embodiment, the method can also include assembling the plurality of singulated third die onto the carrier substrate, and bonding the plurality of third die to the plurality of second die such that at least one third die is bonded to each second die. In some cases, the plurality of singulated first die and the plurality of singulated third die can be simultaneously assembled onto the carrier substrate. In other cases, the plurality of singulated first die can be assembled first onto the carrier substrate followed by the plurality of singulated third die assembled onto the carrier substrate.

In some embodiments, the method also includes assembling a plurality of singulated third die onto a second carrier substrate, stacking the second substrate and the second carrier substrate such that the plurality of second die are facing the plurality of third die, and bonding the plurality of third die to the plurality of second die such that at least one third die is bonded to each second die. In this embodiment, the second carrier substrate can include a plurality of cavities formed on a top surface of the second carrier substrate, the plurality of cavities includes at least a set of first cavities and a set of second cavities, a first shape of each first cavity is complimentary to a shape of each first die such that each first die bonded to the second substrate fits within each first cavity when the second carrier substrate and the second substrate are stacked, and a second shape of each second cavity is complimentary to a shape of each of the plurality of singulated third die such that each singulated third die fits within each second cavity during assembly of the plurality of singulated third die onto the second carrier substrate.

In some embodiments, bonding the plurality of first die to the plurality of second die forms three-dimensional metal interconnects between properly aligned first die and second die.

In some embodiments, the method also includes testing the plurality of singulated first die prior to assembling the plurality of singulated first die onto the carrier substrate. In some embodiments, the method also includes fabricating the plurality of first die on a first substrate using a first technology, and singulating each of the plurality of first die to form the plurality of singulated first die. In some embodiments, the plurality of second die are fabricated using a second technology different than the first technology. In this embodiment, the plurality of second die can be fabricated on a first side of the second substrate, and the method further comprises forming a plurality of second cavities on a second side of the second substrate. In this embodiment, the method can also include assembling a plurality of singulated third die into the plurality of second cavities on the second substrate. In this embodiment, the method can also include fabricating the plurality of third die on a third substrate using a third technology, and singulating each of the plurality of third die to form the plurality of singulated third die. In this embodiment, the third technology can be different than the first technology and the second technology. In this embodiment, the method can also include forming a plurality of vias through the second substrate from the first side to the second side. In this embodiment, the method can also include adding a plurality of solder balls to the second side of the second substrate, where each solder ball is coupled to one of the plurality of vias. Each third die can be electrically coupled to the first side of the second substrate via at least one via. The method can also include assembling a plurality of singulated first die into the plurality of second cavities on the second substrate. The method can also include assembling a plurality of passive elements into the plurality of second cavities on the second substrate. In some embodiments, each of the plurality of second cavities in the second substrate has one or more layers formed therein. In some cases, at least one layer comprises an insulating layer. In other cases, at least one layer comprises a metalized layer. In some embodiments, one or more of the plurality of third die include one or more layers formed on a back side of the third die facing the cavity.

In some embodiments, the first substrate has a first diameter and the second substrate has a second diameter, the first diameter different than the second diameter. In other embodiments, the first substrate has a first diameter and the second substrate has a second diameter, the first diameter equals the second diameter. In some embodiments, the first substrate has a first form factor and the second substrate has a second form factor, the first form factor different than the second form factor. In other embodiments, the first substrate has a first form factor and the second substrate has a second form factor, the first form factor equals the second form factor. In some embodiments, bonding at least one first die to the corresponding one second die forms interconnects between the at least one first die and the corresponding one second die. In some embodiments, a size of each of the plurality of first die is different than a size of each of the plurality of second die. In some embodiments, the method also includes cutting the second substrate to form singulated die stacks, each singulated die stack including one of the plurality of second die and the at least one first die bonded to the one second die. In some embodiments, the plurality of first die are assembled on the carrier substrate according to a first die pattern such that when the carrier substrate and the second substrate are stacked, at least one first die is aligned with each of the plurality of second die. In some embodiments, assembling the plurality of singulated first die onto the carrier substrate comprises a fluidic self-assembly process. In some embodiments, assembling the plurality of singulated first die onto the carrier substrate comprises a self-aligning pick and place process. In some embodiments, the method also includes forming a redistribution layer on a top surface of the plurality of first die and a top surface of the carrier substrate prior to bonding the plurality of first die to the plurality of second die. In some embodiments, the method also includes forming a planarized layer on a top surface of the plurality of first die and a top surface of the carrier substrate prior to bonding the plurality of first die to the plurality of second die, wherein the planarized layer includes metal interconnects, each first die coupled to at least one metal interconnect.

In yet another aspect, another method of assembly is disclosed. The method includes fabricating a plurality of first die on a first substrate using a first technology, wherein the first substrate has a first form factor; singulating each of the plurality of first die to form a plurality of singulated first die; assembling the plurality of singulated first die onto a carrier substrate; fabricating a plurality of second die on a second substrate using a second technology different than the first technology, wherein the second substrate has a second form factor different than the first form factor, and the second form factor is the same as a form factor of the carrier substrate; stacking the second substrate and the carrier substrate such that the plurality of second die are facing the plurality of first die; and bonding the plurality of first die to the plurality of second die such that at least one first die is bonded to each second die.

In another aspect, a method of assembly includes providing a plurality of singulated first die; fabricating a carrier substrate including a plurality of sloped cavities formed on a first surface of the carrier substrate, wherein each of the cavities is shaped substantially the same as a shape of the singulated first die; and assembling one of the plurality of singulated first die into each of the plurality of cavities of the carrier substrate using a self-aligning pick and place process, wherein the shape of the singulated first die and the shape of the sloped cavity enables the singulated first die to self-align within the cavity. In some embodiments, the method also includes forming a redistribution layer on a top surface of the plurality of first die and the top surface of the carrier substrate. In other embodiments, the method also includes forming a planarized layer on a top surface of the plurality of first die and a top surface of the carrier substrate, wherein the planarized layer includes metal interconnects, each first die coupled to at least one metal interconnect.

In yet another aspect, a method of assembly includes providing a plurality of singulated first die; fabricating a carrier substrate including a plurality of cavities formed on a first surface of the carrier substrate, wherein each of the plurality of cavities in the carrier substrate has one or more layers formed therein; and assembling one of the plurality of singulated first die into each of the plurality of cavities of the carrier substrate. In some embodiments, at least one layer comprises an insulating layer. In some embodiments, at least one layer comprises a metalized layer. In some embodiments, the method also includes forming a redistribution layer on a top surface of the plurality of first die and the top surface of the carrier substrate. In other embodiments, the method also includes forming a planarized layer on a top surface of the plurality of first die and a top surface of the carrier substrate, wherein the planarized layer includes metal interconnects, each first die coupled to at least one metal interconnect.

In another aspect, a method of assembly includes fabricating a plurality of singulated first die, wherein each of the plurality of first die include one or more layers formed on a back side of the first die; fabricating a carrier substrate including a plurality of cavities formed on a first surface of the carrier substrate; and assembling one of the plurality of singulated first die into each of the plurality of cavities of the carrier substrate such that the back side of the first die faces the cavity. In some embodiments, at least one layer comprises an insulating layer. In some embodiments, at least one layer comprises a metalized layer. In some embodiments, the method also includes forming a redistribution layer on a top surface of the plurality of first die and the top surface of the carrier substrate. In other embodiments, the method also includes forming a planarized layer on a top surface of the plurality of first die and a top surface of the carrier substrate, wherein the planarized layer includes metal interconnects, each first die coupled to at least one metal interconnect.

In yet another aspect, a method of assembly includes assembling a plurality of singulated first die onto a first side of a carrier substrate; fabricating one or more power transistors on a second substrate, wherein the second substrate includes an active circuit first side and a second side opposite the first side; stacking the second substrate and the carrier substrate such that the second side of the second substrate faces a second side of the carrier substrate; and coupling the second side of the carrier substrate to the second side of the second substrate. In some embodiments, the method also includes forming a redistribution layer on a top surface of the plurality of first die and the first side of the carrier substrate. In other embodiments, the method also includes forming a planarized layer on a top surface of the plurality of first die and the first side of the carrier substrate, wherein the planarized layer includes metal interconnects, each first die coupled to at least one metal interconnect. In some embodiments, the method also includes mounting the first side of the second substrate to a lead frame.

BRIEF DESCRIPTION OF THE DRAWINGS

FIG. 15 illustrates an assembly process of a carrier substrate using a pick and place technique.

DETAILED DESCRIPTION

Figure 1:
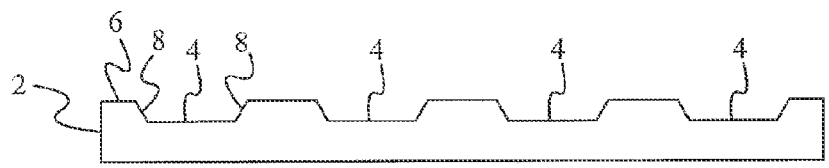
FIG. 1 illustrates a cut-out side view of a substrate having a plurality of cavities formed in a top surface of the substrate.
Figure 2:
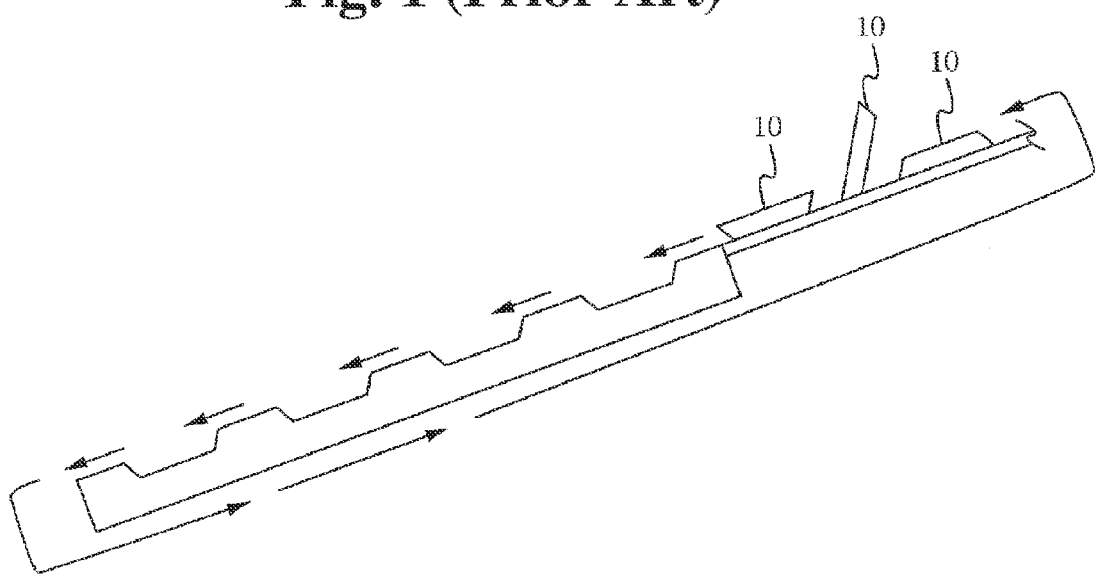
FIG. 2 illustrates the substrate of FIG. 1 subjected to the fluidic self-assembly process.
Figure 3:
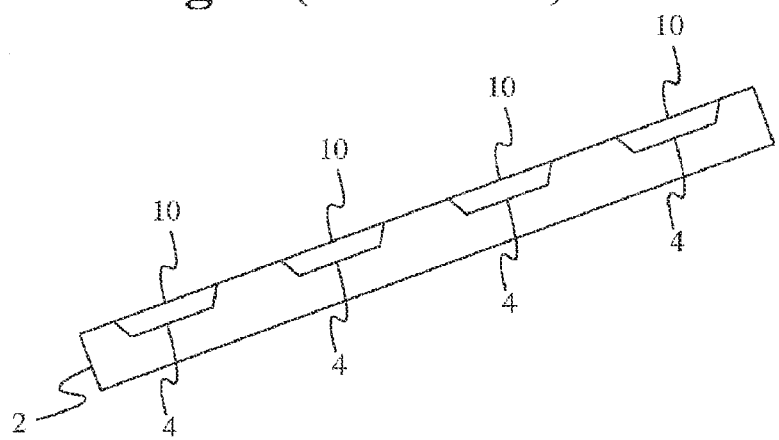
FIG. 3 illustrates the substrate of FIGS. 1 and 2 after the fluidic self-assembly process is completed.

Embodiments of the present application are directed to an assembly process. Those of ordinary skill in the art will realize that the following detailed description of the assembly process is illustrative only and is not intended to be in any way limiting. Other embodiments of the assembly process will readily suggest themselves to such skilled persons having the benefit of this disclosure.

Reference will now be made in detail to implementations of the assembly process as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions will likely be made in order to achieve the developer's specific goals, such as compliance with application and business related constraints, and that these specific goals can vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of an assembly process include an assembly process to properly position and align a plurality of first die with a carrier substrate. The first die are fabricated according to a first technology. The carrier substrate is then aligned with a second substrate having a plurality of second die fabricated therein. The second substrate, and therefore the plurality of second die, are fabricated according to a second technology different than the first technology. The plurality of first die are positioned within cavities formed in the first interface surface of the carrier substrate. The cavities in the first interface surface of the carrier are preferably profiled to accept the die in only a single orientation. The interfacing surfaces of the carrier substrate and the second substrate include active circuitry of the first die and the second die. The carrier substrate is aligned to the second substrate. This step also aligns each of the plurality of first die with the plurality of second die. One or more first die can be aligned with each second die. Once aligned, a wafer bonding process is performed to bond the first die to the second die. Metal interconnects between the active circuitry of the first die and the second die are formed during the wafer bonding process. In some embodiments, once the wafer bonding process is completed, the carrier substrate is removed, leaving behind the plurality of first die bonded to the plurality of second die of the second substrate. A passivation layer or a planarization layer can be added over the plurality of first die and second substrate. In other embodiments, the carrier substrate is left in place to form a cap. The second substrate is then cut to singulate each of the plurality of second die. Each singulated second die and the one or more first die bonded to the second die form a die stack.

In general, it is an objective of the assembly process to couple a first substrate having a first form factor and a second substrate having a second form factor different than the first form factor using assembly and wafer bonding technologies. It is also an objective of the assembly process to couple multiple die having disparate die types, for example different die fabrication technologies, different die shapes, and/or different die sizes. The first substrate is used to fabricate the plurality of first die. The plurality of first die are singulated and then self-assembled into the carrier substrate. The carrier substrate has the same form factor as the second substrate. The plurality of second die are fabricated on the second substrate. In some embodiments, the carrier substrate is used as an intermediary, where the plurality of first die can be fabricated using a first technology, such as GaAs (Galium Arsenide) technology, having a first form factor, such as a 6 inch diameter wafer, and then assembled onto the carrier substrate have a second form factor, such as an 8 inch diameter substrate. The wafer bonding process is then performed on the carrier substrate having the second form factor and the second substrate also having the second form factor, for example an 8 inch diameter wafer, where the plurality of second die can be fabricated on the second substrate using a second technology, such as CMOS (complimentary metal-oxide-semiconductor) technology. In this manner, die fabricated using different types of technology and different form factors can be assembled together. In this case, the first form factor is different than the second form factor. In other embodiments, the first form factor is the same as the second form factor. For example, the diameter of the first substrate is the same as the diameter of the second substrate. Such assembly is achieved at the packaging stage, not at the wafer fabrication stage. These die are also assembled with high density interconnects.

The assembly process uses the carrier substrate as an intermediate mechanism for temporarily holding the plurality of first die in a desired position and orientation for mating with the second substrate having a plurality of second die. In some embodiments, the carrier substrate is an intermediate mechanism for temporarily holding the plurality of first die. In other embodiments, the carrier substrate is retained as part of the finished package. An assembly step is used to position the plurality of first die on the carrier substrate. In some embodiments, a shape-based fluidic self-assembly process is used. In other embodiments, non-fluidic self-assembly processes can be used. For example, the shape-based fluidic self-assembly technique can be adapted so that the singulated first die are coated with a magnetic material, such as a thin layer of iron, on the surface that is to be at the bottom of the cavity, for example the "back" side of the singulated first die. The magnetic material is magnetized in a certain direction so that when a magnetic field is applied, the die orient themselves properly. A magnet is then used to move the singulated first die across the top surface of the carrier substrate, similarly to the fluid carrying singulated die. The magnet can be positioned above or below the carrier substrate, and the magnet moves until all cavities within the carrier substrate are filled with singulated first die. Moving the magnet is optional, especially if this is combined with fluidic self-assembly. Alternatively, each singulated first die has a magnetic coating that is magnetized in a particular direction, and a magnetic field is applied during the fluidic self-assembly process to ensure proper orientation of the first die relative to the cavities. Another self-assembly technique that does not use fluid is an agitation technique where singulated first die are positioned on the top surface of the carrier substrate and the carrier substrate is agitated, such as by an ultrasonic transducer, thereby agitating the singulated first die into the cavities.

In some embodiments, a self-aligning pick and place technique is used to position the plurality of first die within the cavities of the carrier substrate. FIG. 15 illustrates an assembly process of a carrier substrate using a pick and place technique. A carrier substrate 102 includes a plurality of cavities 104. A first die 110 is positioned within each of the cavities 104 using a pick and place machine 200. Using a shape based technique associated with a size and shape of the cavities 104 in the carrier substrate 102, the pick and place machine 200 places a first die over the cavity. Dropping the first die into the cavity allows the first die to self-align accurately within the cavity due to the shape of the cavity. In some embodiments, the cavity has inwardly sloping sides. The first die is positioned close enough to the cavity to enable the first die to slide into the cavity. The sloped edges of the cavity direct the first die properly into place. The positional accuracy of the pick and place machine is reduced compared to conventional techniques since the first die does not have to be exactly aligned and positioned by the pick and place machine. Reducing the positional accuracy required by the pick and place machine also increases the assembly speed of filling all the cavities in the carrier substrate. In general, the pick and place machine does not have to be as accurate or take as much time placing each first die as conventional pick and place techniques.

Figure 4:
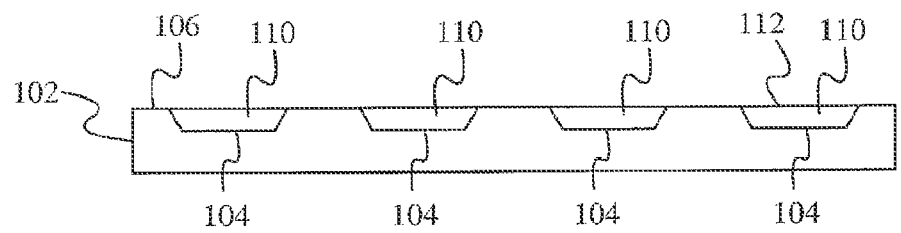
FIG. 4 illustrates a cut out side view of an exemplary carrier substrate after a self-assembly process is performed.

FIG. 4 illustrates a cut out side view of an exemplary carrier substrate after an assembly step is performed. The carrier substrate 102 includes a plurality of cavities 104. A first die 110 is positioned within each of the cavities 104. In this exemplary configuration, each of the cavities 104 is shaped the same, and each of the first die 110 are shaped the same and are of the same type, for example all of the first die 110 are fabricated using a first technology. In this exemplary configuration, a top surface 112 of each first die 110 is co-planar with a top surface 106 of the carrier substrate when the first die 110 is positioned within the cavity 104. In other configurations, the cavities and the first die are configured such that the top surface of the first die extends above the top surface of the carrier substrate. In an exemplary application, the plurality of first die are made from GaAs fabricated on a six inch diameter wafer, and the carrier substrate has an eight inch diameter.

To determine if all cavities within the carrier substrate have been filled with first die, an inspection is periodically performed. Preferably the inspection is an optical inspection. The inspection can be manual or automated. If it is determined that one or more cavities remain empty, then the assembly step is continued. If it is determined that all cavities are filled, then the assembly step is stopped.

There are different mechanisms that maintain the first die in place within the cavities of the carrier substrate. One mechanism is the force between the die and the sidewalls of the cavity, referred to as a Van Der Waals force, which is intrinsic to all materials. In addition to the sidewalls, the bottom of the cavity can also provide an adhesive Van Der Waals force. Another mechanism can be to apply a weak adhesive within the cavity so that when the first die falls into the cavity during assembly, the adhesive maintains the first die within the cavity. It is understood that other conventional mechanisms can be used to maintain the first die within the cavity. The mechanism used to retain the first die within the cavity must be able to be overcome during a subsequent processing step so as to enable removal of the first die from the cavity.

Using the assembly process, the first die fabricated on a first substrate having a first form factor, such as six inches in diameter, are transferred to the carrier substrate having a second form factor, such as eight inches in diameter, which is different than the first form factor. Alternatively, the first form factor can be the same as the second form factor. The form factor of the carrier substrate is the same as a form factor of a second substrate to which the first die are to be subsequently connected.

Figure 5:
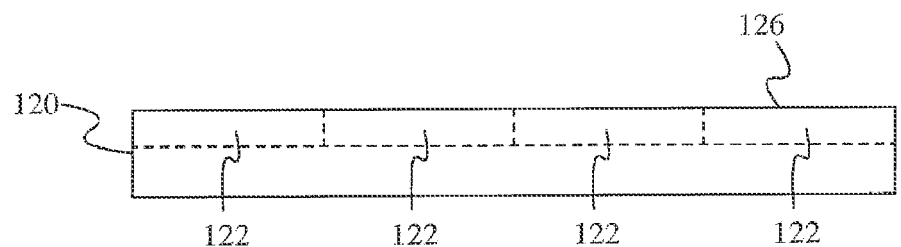
FIG. 5 illustrates a cut out side view of an exemplary second substrate after a plurality of second die are fabricated.

The second substrate is fabricated to have a plurality of second die, which preferably are larger in size than the first die fabricated on the first substrate. FIG. 5 illustrates a cut out side view of an exemplary second substrate 120 after the plurality of second die 122 are fabricated. The second die are fabricated using a second technology, such as CMOS, which is different than the first technology used to fabricate the first die. Also, the size of the second die is larger than the size of the first die. For example, a GaAs first die is 50 mils a side, and a CMOS second die is 200 mils a side.

Figure 6:
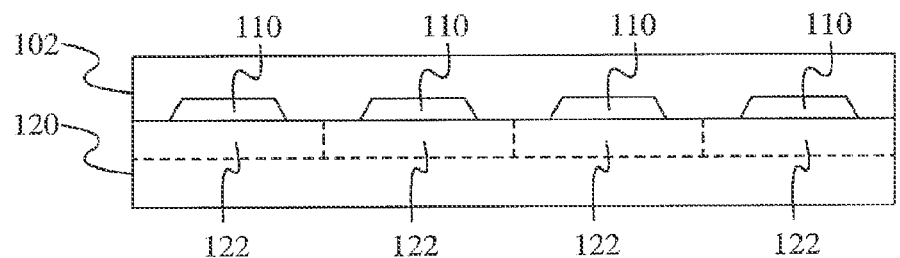
FIG. 6 illustrates the alignment of the carrier substrate of FIG. 4 on top of the second substrate of FIG. 5.

The carrier substrate including the assembled first die and the second substrate including the fabricated second die are then aligned. In some embodiments, the second substrate 120 is positioned with the surface 126 facing upward, and therefore with the exposed surface of each second die 122 facing upward. The carrier substrate 102 is turned upside down so that the surface 106 is turned downward, facing the surface 126 of the second substrate. The retention mechanism is sufficient to maintain the first die within the cavities of the carrier substrate in the upside down configuration. FIG. 6 illustrates the alignment of the carrier substrate 102 of FIG. 4 on top of the second substrate 120 of FIG. 5. In other embodiments, the carrier substrate 102 is positioned with the surface 106 facing upward, and therefore with the exposed surface 112 of each first die 110 facing upward. In this case, the second substrate 120 is turned upside down so that the surface 126 is turned downward, facing the surface 106 of the carrier substrate 102. Under these circumstances, gravity also aids in maintaining the die 110 in the carrier substrate 102.

In some embodiments, the carrier substrate including the assembled first die and the second substrate including the second die are aligned for bonding by an optical alignment device, such as an infrared camera, that "looks" through the two substrates to properly align the two to each other. Such optical alignment devices and processes are well known in the art. Once aligned, the surface 112 of each first die 110 is facing the surface 126 of the second substrate 120, and therefore facing the surface of each second die 122. Since the carrier substrate and the second substrate each have the same form factor, aligning the two substrates is simply a matter of aligning the perimeters of the two substrates. In some embodiments, the cavities in the carrier substrate are positioned such that one assembled first die is aligned with one of the second die on the second substrate. Other configurations are also contemplated, and are discussed in detail below.

A wafer bonding process is then performed between the carrier substrate including the assembled first die and the second substrate including the fabricated second die. The wafer bonding process results in dense interconnects between each bonded first die and second die. It is understood that conventional wafer bonding techniques account for the various specifics related to formation of the interconnects, for example the specific chemistries that are used, and the necessary heights and clearances used. The details of these techniques are application specific, and therefore vary depending on the types and characteristics of the die to be bonded.

The wafer bonding process is performed in part by pressing the two substrates together and applying heat. In some embodiments, on the second substrate, in spaces between the second die, there may be bumps that prevent the spaces on the second substrate from bonding with the corresponding surface on the carrier substrate. In some embodiments, an adhesive coating can be applied between the two wafers in a manner that does not interfere with the metal connections. This ensures that only the interface surfaces of the first die and the second die are bonded, while the remaining surfaces are not bonded. In other embodiments, the exposed surface of the first die and the top surface of the carrier substrate are not planar, with the first die extending slightly above the top surface of the carrier substrate. This configuration provides a gap between the top surface of the carrier substrate and the top surface of the second substrate when the first die in the carrier substrate are in contact with the second die in the second substrate.

Figure 7:
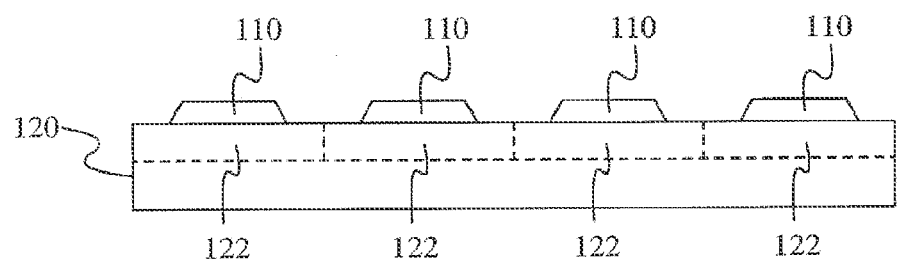
FIG. 7 illustrates the assembly of FIG. 6 after the wafer bonding process has been performed and the carrier substrate has been removed.

In some embodiments, any force keeping the first die within the cavities of the carrier substrate is less than the bonding force between the first die and the second die. As such, the carrier substrate can be removed, leaving behind the first die bonded to the second die of the second substrate. FIG. 7 illustrates the assembly of FIG. 6 after the wafer bonding process has been performed and the carrier substrate has been removed. In some embodiments, each first die has a metalized back surface. In other embodiments, the back surface has an oxide layer. In some embodiments, where an adhesive is used to hold the first die within the cavities of the carrier substrate, a solvent can be applied prior to removing the carrier substrate, thereby weakening the adhesive and allowing the carrier substrate to be removed. The second substrate is then cut to singulate each second die and the corresponding first die bonded to the singulated second die, thereby forming a plurality of singulated die stacks. In some embodiments, prior to singulating the die stacks, a passivation layer or a planarization layer is formed over the front side surface of the second substrate and the plurality of first die bonded to the front side surface, such as the layer 140 in FIG. 7. A top surface of this layer can be metalized. In other embodiments, the plurality of first die bonded to the second substrate are left exposed, and the exposed back surface of the first die can be metalized.

The resulting singulated die stacks have a first die made of a first material/technology bonded to a second die made of a second material/technology that is different than the first material/technology. Further, there is a high density of interconnects between the bonded first die and second die. With a high density of interconnects comes low parasitics. The performance of the overall device is limited by the parasitics. Lower parasitics is particularly useful, for example, in the mating of CMOS devices and bipolar, GaAs, or GaN devices, which are high speed devices. Conventional side by side or stacked die techniques are more limited by the parasitics than the devices assembled using the assembly process. Additionally, the assembly process enables the mating of different substrate/wafer sizes. Connecting die from different wafer sizes enables a less expensive wafer type, such as a second wafer made of silicon, to continue to increase in size, such as 12 inch diameters, while keeping more expensive wafer types, such as GaAs or GaN, to smaller sizes, such as 6 or 8 inch diameters.

Before performing the assembly step, the plurality of first die are tested to that only properly functioning first die are assembled onto the carrier substrate. However, the second die still part of the uncut second substrate are subject to yield constraints. This is a disadvantage of using the wafer bonding technique when bonding the plurality of first die of the carrier substrate to the plurality of second die on the second substrate. In conventional wafer bonding, neither the die on the first wafer nor the die on the second wafer are tested, and therefore suffer from a cumulative defect density of both wafers being bonded. In contrast, the assembly process does not suffer from a cumulative defect density because the first die are singulated and pre-tested before the assembly step and the subsequent wafer bonding step. Using the assembly process only the second substrate contributes to the defect density of the resulting die stack. Therefore, the assembly process reduces the defect density of die stacks compared to the conventional wafer bonding process.

The assembly process can be expanded to provide additional connectivity. In some embodiments, a size of the second die is greater than a size of the first die. In this case, the first die only covers a portion of the second die when bonded together. For example, the first die measures 50 mils a side, and the second die measures 200 mils a side. In this exemplary case, the assembly process enables mating of the first die and the second die without the first die having to be 200 mils a side. The assembly process provides a translation of a plurality of first die onto a plurality of second die with gaps in between the bonded positions of each the first die. These gaps can be used as bonding sites for other die. Prior to cutting the second substrate and singulating the second die, the remaining uncovered surface area of the second die can be used to be bonded to one or more other die depending on the size of the uncovered surface area and the interface surface area(s) of the other die. The other die can be one or more additional first die, such that multiple first die are bonded to a single second die, and/or the other die can be a third, fourth, fifth, etc. die each fabricated using a different technology than the first die or the second die, for example a third technology, a fourth technology, a fifth technology, etc. The number of other die bonded to the second die is limited only by the surface area of the second die and the surface area of the other die.

Figure 8:
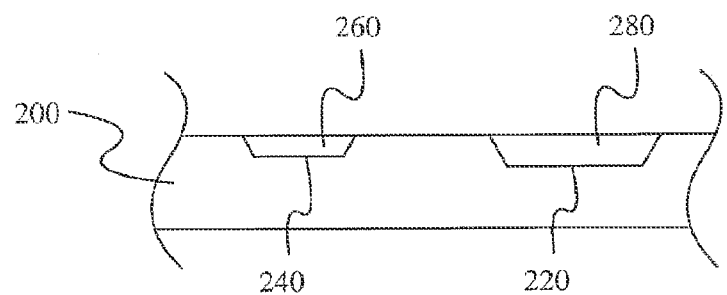
FIG. 8 illustrates a cut out side view of a portion of an exemplary mixed die type carrier substrate configured with different shaped and/or sized cavities that accommodate different types of die.

The assembly step can be adapted to accommodate bonding of multiple die to a single second die. In some embodiments, the carrier substrate is configured with a cavity pattern that has two, or more, cavities aligned with each second die on the second substrate. The cavity sizes, shapes, and positions are configured to accommodate the desired positions and types of die to be bonded to the second die. For example, where two first die are to be bonded to a single second die, the cavity pattern is configured with two cavities per second die and each of the two cavities is configured to accommodate a first die. Where a first die and a third die are to be bonded to a single second die, the cavity pattern is configured with two cavities per second die and one of the two cavities is configured to accommodate a first die and the other of the two cavities is configured to accommodate a third die. In this embodiment, a single carrier substrate is used where the carrier substrate has cavities configured for different die types, the cavities for each die type being shaped differently. FIG. 8 illustrates a cut out side view of a portion of an exemplary mixed die type carrier substrate 200 configured with different shaped and/or sized cavities 220 and 240 that accommodate different types of die 260 and 280, respectively. The portion of the carrier substrate 200 shown in FIG. 8 corresponds to a single second die on the second substrate.

In some embodiments, each different die type can be serially assembled using the fluidic self-assembly process, first one die type is self-assembled into the proper cavities in the mixed-type carrier substrate, then a second die type, and so on. In this case, the die type with the largest corresponding cavity is self-assembled first so as to prevent die types with correspondingly smaller cavities from improperly falling into the larger cavities intended for other die types. Alternatively, the self-assembly process can be simultaneously performed using multiple different die types mixed within a single fluid mixture that flows over the mixed-type carrier substrate. Using this approach, the size and shape of the different die types and the corresponding cavities in the mixed-type carrier substrate must be configured to prohibit die of different types from fitting into the wrong cavities. It is understood that alternative approaches are also contemplated for assembling multiple different die types within a single mixed-type carrier substrate, such as the self-aligning pick and place technique.

In other embodiments, multiple different carrier substrates are used. A first carrier substrate, such as the carrier substrate 102, is used as described above to assemble the plurality of first die within the first carrier substrate, and then to bond the first die to second die on the second substrate. Another assembly step is then performed using a second carrier substrate configured with cavities to be filled with the third die. The pattern of the cavities on this second carrier substrate are aligned with the uncovered portions of the second die on the second wafer. In this case, the second carrier substrate is also configured with a plurality of first die cavities arranged in a pattern that matches the pattern of the plurality of first die bonded to the second wafer. Each of the first die cavities has a size and shape that enables the first die bonded on the second substrate to fit within the first die cavity when the second carrier substrate is bonded to the second substrate. This enables the plurality of third die assembled on the second carrier substrate to contact the uncovered portions of the plurality of second die on the second substrate. Additional carrier substrates can be used to similarly assemble and bond other die types to the second substrate. In general, the assembly process can use one or more variously configured carrier substrates to bond multiple die of the same type or multiple die of different die types to each second die on the second substrate.

Figure 9:
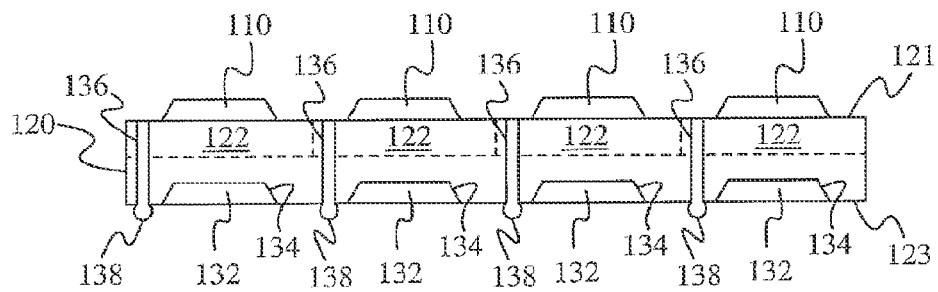
FIG. 9 illustrates a cut out side view of the bonded stack of FIG. 7 where additional die are assembled on the opposite side of the second substrate as the second die and bonded first die.

The assembly process can be further expanded to provide additional connectivity. A plurality of second cavities can be formed on the opposite side of the second substrate as the plurality of second die. The plurality of second cavities are formed as a separate processing step before, during, or after the fabrication of the plurality of second die. Another assembly step can be performed whereby die can be assembled within the second cavities. This assembly step can be performed before or after the first die are bonded to the second die. The die assembled into the second cavities can be of the same or different technologies than the first die and/or the second die. The second cavities are configured according to the desired die geometry. FIG. 9 illustrates a cut out side view of the bonded stack of FIG. 7 where additional die 132 are assembled on the opposite side of the second substrate as the second die 122 and bonded first die 110. A plurality of second cavities 134 are formed into the back side surface 123 of the second substrate 120. The die 132 are assembled into the second cavities 134 in a similar manner as the first die 110 are assembled into the carrier substrate 102 (FIG. 4). Furthermore, through-silicon vias (TSVs) 136 can be formed within the second substrate 120 to provide connections between devices on the front side surface 121 of the second substrate 120, such as the second die 122 or the bonded first die 110, and devices on the back side surface 123 of the second substrate 120, such as the die 132 assembled in the second cavities 134. The TSVs can also be electrically coupled to any other interconnects on either the surface 121 or the surface 123 of the second substrate 120. Metal interconnects can be formed on the surface 121 to couple the TSV 136 to the second die 122 and/or the first die 110. Similarly, metal interconnects can be formed on the surface 123 to couple the TSV 136 to the second die 132. The TSVs serve both as electrical interconnects and as thermal conduction mechanisms for transferring heat from the second die 122 and/or the first die 110 to a printed circuit board, via the solder balls 138.

Although each first die 110 on the front-side surface 121 is shown to be aligned with one of the die 132 on the back side surface 123, this is merely an exemplary configuration. The pattern and sizes of the plurality of first die 110, the pattern and sizes of the plurality of die 132, and their positional relationship to each other can be varied based on application.

In some embodiments, solder balls are attached at the end points of the TSVs, for example solder ball 138 in FIG. 9. The solder balls can be used to couple the die stack to a printed circuit board or to a test device. Alternatively, the solder balls are coupled the end points of the TSVs via metal interconnects on surface 123. In other embodiments, the surface 123 includes a metalization pattern that can be bonded out using conventional techniques.

Figure 10:
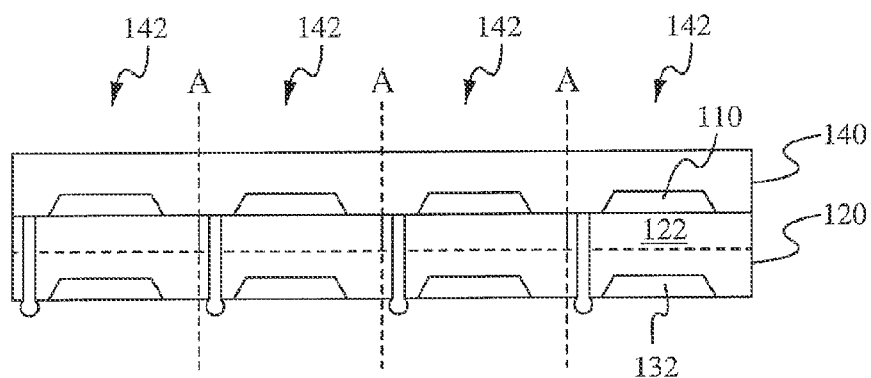
FIG. 10 illustrates a cut out side view of the bonded stack of FIG. 9 including a planarized insulating layer.

In some embodiments, a layer of insulating material is applied over the front side surface of the second substrate and the plurality of first die bonded to the front side surface. This insulating material is then planarized. FIG. 10 illustrates a cut out side view of the bonded stack of FIG. 9 including a planarized insulating layer 140 applied over the first die 110 and the surface 121. In some embodiments, the planarized surface can be patterned, etched, and metalized to form vertical and/or lateral metal interconnects with the first die. In some embodiments, the insulating layer is not applied. Instead, each of the first die has a metalized back surface. An electrical lead can be connected to the metalized back surface.

The bonded stack is cut to form singulated die stacks. For example, a portion of the cuts are shown along lines A in FIG. 10. The cuts form die stacks 142. In the exemplary configuration of FIG. 10, each die stack 142 includes three die, the first die 110, the second die 122, and the die 132. Where each die stack includes a planarized surface and one or more solder balls on the opposite surface, the die stack can be easily tested by placing the die stack upside-down on a flat surface and applying a test probe to the one or more solder balls.

In still other embodiments, a cap can be used instead of an insulating layer, such as the insulating layer 140 in FIG. 7. The cap is configured with cavities that are aligned with the plurality of first die bonded to the second substrate. In some configurations, the cap cavities are shaped to match the shape of the first die so as to provide an intimate contact between the cap cavity surface and the first die. In other configurations, the cap cavities are larger than the first die so as to leave an air gap between cap cavity surface and the first die when the cap is coupled to the second substrate.

The assembly process is described above as using the carrier substrate as an intermediate mechanism for temporarily holding the plurality of first die, where the carrier substrate is removed after the wafer bonding process is performed. In alternative embodiments, the carrier substrate is not an intermediate mechanism for temporarily holding the plurality of first die. Instead, the carrier substrate is retained as part of the finished die package, which is subsequently cut to form singulated die stacks. In these embodiments, the carrier substrate is retained as a cap, as shown in FIG. 6, and subsequent process is performed with the carrier substrate remaining. For example, a finished bonded stack resembling the structure of FIG. 10 is formed, except that the insulating layer 140 in FIG. 10 is replaced by the carrier substrate 102.

Figure 11:
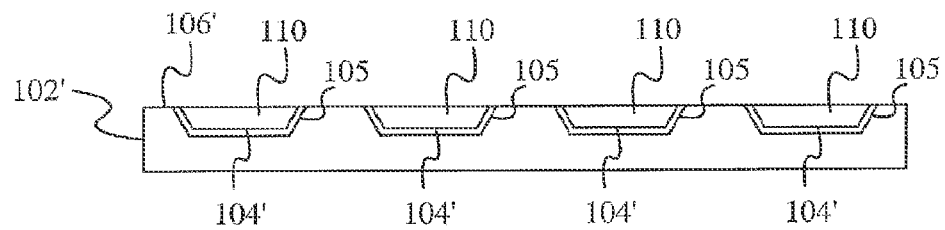
FIG. 11 illustrates a cut out side view of an adapted carrier substrate of FIG. 4 according to an embodiment.
Figure 12:
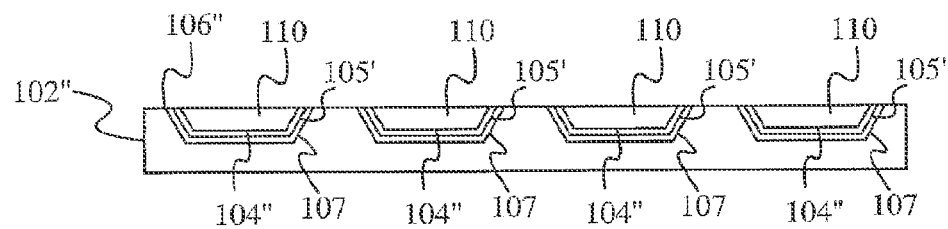
FIG. 12 illustrates a cut out side view of an adapted carrier substrate of FIG. 4 according to another embodiment.

Since the carrier substrate is retained as part of the finished package, the carrier substrate can be adapted to include additional structure and functionality. For example, prior to assembling the first die within the first cavities of the carrier substrate, the first cavities can be fabricated to include additional layers. FIG. 11 illustrates a cut out side view of an adapted carrier substrate of FIG. 4. The carrier substrate 102' includes a plurality of cavities 104'. One or more layers can be added using well known semiconductor fabrication techniques. In FIG. 11, a single additional layer 105 is added. The layer 105 can be an oxide isolation layer or a metal layer. FIG. 12 shows two layers 105' and 107 added to each cavity 104". In an exemplary configuration, the layer 105' is metal layer and the layer 107 is an oxide layer. The final shape of the cavities 104' including the layer 105, or the cavities 104" including the layers 105' and 107, are configured so as to accept the first die, or other die, according to the assembly processes described above. In some embodiments, the carrier substrate and cavities are not adapted to include one or more additional layers, but instead the one or more additional layers are formed on the first die prior to be assembled in the cavities of the carrier substrate. In this case, the cavities are formed to accommodate the larger form factor of the first die including the one or more additional layers. In some embodiments, the carrier substrate including the additional layer(s) in the cavities is not bonded to a second substrate. Instead, the carrier substrate is cut to singulate the first die, or groups of first die. In this case, bumps can be added to the active circuitry side, or to the oppose side and coupled to the active circuitry using through silicon vias, prior to cutting the carrier substrate. Exemplary applications enabled by the one or more additional layers include, but are not limited to, electrical isolation of each die in a multiple die configuration, lateral optical isolation between a light emitting source and adjacent circuitry, and lateral and backside radio frequency shielding. In another exemplary application, the first die can be a power transistor, a first terminal of the power transistor is coupled to a metalized layer coupled to the backside of the die within the cavity, such as the metalized layer 105' in FIG. 12, and one or more source terminals are coupled to the top side (active circuitry) of the die. An oxide layer, such as the oxide layer 107 in FIG. 12, is formed between the metalized layer and the carrier substrate. This configuration provides a pseudo-vertical DMOS structure. In yet another exemplary application, the power transistor example can be extended to include multiple power transistors configured laterally within the carrier substrate. In this case, there may be no need for an oxide layer or a back side metalized layer.

Figure 13:
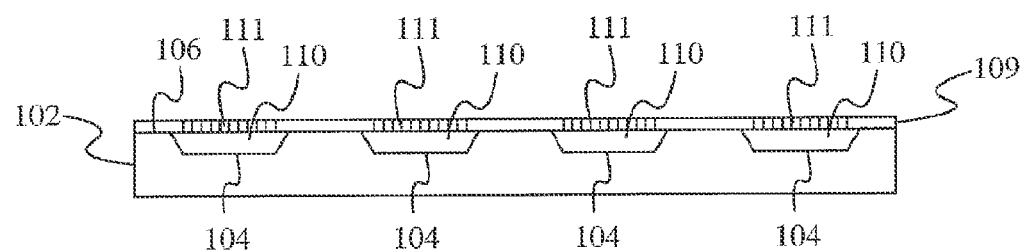
FIG. 13 illustrates the assembled carrier substrate of FIG. 4 including a planarized passivation layer and metal interconnects.
Figure 14:
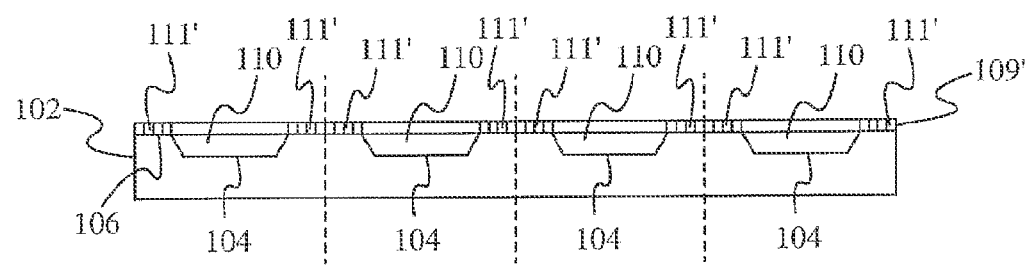
FIG. 14 illustrates the assembled carrier substrate of FIG. 4 including a redistribution layer added across the surfaces of each first die and the surface of the carrier substrate.

In the embodiments where the carrier substrate is retained as part of the finished package, additional processing can be performed. For example, once the cavities 104, 104, 104" are filled with first die 110, a passivation layer can be deposited over the top surface 106, 106', 106" and the exposed surface of each first die 110 to form a planarized surface. The planarized surface can be patterned, etched, and metalized to form high density vertical and/or lateral metal interconnects with the first die. FIG. 13 illustrates the assembled carrier substrate 102 of FIG. 4 including a planarized passivation layer 109 and metal interconnects 111. In the exemplary configuration of FIG. 13, the metal interconnects 111 are configured as vertical interconnects coupled to the surface 112 of the first die 110. In an alternative configuration, as shown in FIG. 14, a redistribution layer (RDL) 109' including metal interconnects 111' is added across the surface 112 of the first die and the surface 106 of the carrier substrate 102. The metal interconnects 111' re-route some or all of the interconnections from the area coinciding with the first die 110 to the area coinciding with the carrier substrate 102. This configuration is referred to as an interposer technology, or a fan out structure. The input/output (I/O) interface with the first die 110 is "fanned out" from the surface 112 of the first die 110 to the surface 106 of the carrier substrate 102. The carrier substrate top surface is used to expand the connection area to the active circuitry of the first die. The fan out structure is particularly useful when first die are used that are pad limited. The fan out structure is also useful when the first die material is more expensive than the carrier substrate material. Using the "real estate" of the less expensive carrier substrate as the fan out area is more cost effective than configuring the more expensive first die with fan out area. In some embodiments, the resulting carrier substrate is wafer bonded to a second substrate as previously described. During the subsequent wafer bonding process, the metal interconnects on the carrier substrate are bonded to corresponding metal interconnects of the plurality of second die on the second substrate. In other embodiments, the carrier substrate is not bonded to a second substrate. Instead, the carrier substrate is cut, such as along the dotted lines in FIG. 14, to singulate the first die, or groups of first die. In this alternative configuration, bumps can be added to the active circuitry side, or to the oppose side and coupled to the active circuitry using through silicon vias, prior to cutting the carrier substrate. In still other embodiments, the second substrate is replaced by a power FET wafer and the back side of the carrier substrate is coupled to the power FET wafer. In this configuration, the first die assembled in the carrier wafer functions as the control circuitry for the power FET. Gate connections to the power FETs are done through bond wires coupled to the first die. Preferably, the back side of the carrier substrate is coupled to the back side of the power FET wafer.

Similar modifications as described in relation to FIGS. 11-14 can be applied to the backside 123 of the substrate 120, the cavities 134 formed in the second substrate 120, and the plurality of second die 132. In some embodiments, the back side of the second substrate can be mounted to a lead frame to provide electrical connections.

As an alternative to placing a die into a second cavity on the back-side of the second substrate, a magnetic core can be positioned in the second cavity. Through the use of multiple TSVs, and metalization on the top and bottom surfaces of the second substrate, toroidal windings can be formed around the magnetic core to form a transformer. Application of the proper first die and second die, along with the transformer provide the elements of a power circuit. It is understood that the first die and second die are merely representative of other electrical device types that can be used. The other electrical device types can include, but are not limited to, flash memory devices or passive elements, such as inductors.

Varying combinations of the various process steps described above can be used. For example, instead of bonding the active circuit front side of the carrier substrate to the active circuit front side of the second substrate, the back side of the carrier substrate is coupled to the back side of the second substrate, such as using an adhesive. The active circuit front side of the carrier substrate can be mounted to a lead frame to provide electrical connections, and the active circuit front side of the second substrate can be used as control die.

The assembly process has been described in terms of specific embodiments incorporating details to facilitate the understanding of the principles of construction and operation of the assembly process. Such references, herein, to specific embodiments and details thereof are not intended to limit the scope of the claims appended hereto. It will be apparent to those skilled in the art that modifications can be made in the embodiments chosen for illustration without departing from the spirit and scope of the assembly process.

What is claimed is:

1. A method of assembly comprising:
    assembling a plurality of singulated first die onto a carrier substrate;
    fabricating a plurality of second die on a first side of a second substrate;
    assembling a plurality of singulated third die onto a second side of the second substrate;
    stacking the second substrate and the carrier substrate such that the plurality of second die are facing the plurality of first die, wherein the first side of the second substrate and a first side of the carrier substrate face each other such that active circuitry of the plurality of first die faces active circuitry of the plurality of second die;
    bonding the plurality of first die directly to the plurality of second die such that at least one second die is operatively bonded to a respective first die to furnish an electrical interconnect between the at least one second die and the respective first die and third die;
    forming vias through the second substrate to establish electrical interconnects between the first, second, and third die such that the at least one second die and the respective first die are both electrically connected to a respective third die, wherein at least one of the vias is formed through the at least one second die;
    removing the carrier substrate, thereby leaving the plurality of first die exposed; and;
    after removing the carrier substrate, adding a cap structure over the plurality of first die and coupling the cap structure to the second substrate such that a surface opposite an active circuit portion of each of the plurality of first die is facing the cap structure, wherein the cap structure includes a plurality of cavities, each cavity aligned with a corresponding one first die and having a shape and a size that matches the corresponding one first die.

2. The method of claim 1, wherein each of the plurality of first die has a metalized back surface.

3. The method of claim 1, further comprising applying an insulating layer over the plurality of bonded first die and the second substrate.

4. The method of claim 1, further comprising:
    cutting through the cap structure and the second substrate to form at least one singulated die stack including the at least one second die, the respective first die, and the respective third die.

* * * * *